(12) United States Patent
Lee et al.

(10) Patent No.: US 10,879,302 B2
(45) Date of Patent: Dec. 29, 2020

(54) IMAGE SENSORS AND ELECTRONIC DEVICES

(71) Applicant: Samsung Electronics Co., Ltd., Suwon-si (KR)

(72) Inventors: Kwang Hee Lee, Yongin-si (KR); Gae Hwang Lee, Seongnam-si (KR); Sung Young Yun, Suwon-si (KR); Dong-Seok Leem, Hwaseong-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/196,229

(22) Filed: Nov. 20, 2018

(65) Prior Publication Data

US 2019/0319062 A1 Oct. 17, 2019

(30) Foreign Application Priority Data

Apr. 13, 2018 (KR) .................. 10-2018-0043587

(51) Int. Cl.
*H01L 27/146* (2006.01)
*G02B 5/20* (2006.01)

(52) U.S. Cl.
CPC ........ *H01L 27/14647* (2013.01); *G02B 5/201* (2013.01); *G02B 5/208* (2013.01); *H01L 27/14607* (2013.01); *H01L 27/14621* (2013.01); *H01L 27/14627* (2013.01); *H01L 27/14652* (2013.01)

(58) Field of Classification Search
CPC ......... H01L 27/14647; H01L 27/14607; H01L 27/14621; H01L 27/14627; H01L 27/14652; G02B 5/201; G02B 5/208
See application file for complete search history.

(56) References Cited

U.S. PATENT DOCUMENTS 4,246,601 A 1/1981 Sato et al.
6,330,029 B1 12/2001 Hamilton et al.
(Continued)

FOREIGN PATENT DOCUMENTS

JP 2009088255 A 4/2009
JP 4291793 B2 7/2009
(Continued)

*Primary Examiner* — Fernando L Toledo
*Assistant Examiner* — Neil R Prasad
(74) *Attorney, Agent, or Firm* — Harness, Dickey & Pierce, P.L.C.

(57) ABSTRACT

An image sensor may include a photoelectric device configured to selectively absorb light associated with a first color of three primary colors, a semiconductor substrate that is stacked with the photoelectric device and includes first and second photo-sensing devices configured to sense light associated with second and third colors of three primary colors. The first and second photo-sensing devices may have different thicknesses, different depths from a surface of the semiconductor substrate, or different thicknesses and different depths from the surface of the semiconductor substrate. At least one part of a thickness area of the first photo-sensing device may overlap at least one part of a thickness area of the second photo-sensing device in a parallel direction extending substantially parallel to the surface of the semiconductor substrate.

35 Claims, 11 Drawing Sheets

(56) References Cited

U.S. PATENT DOCUMENTS

| | | | |
|---|---|---|---|
| 7,656,453 B2 | 2/2010 | Nishi | |
| 7,667,750 B2 | 2/2010 | Goto et al. | |
| 7,968,923 B2 | 6/2011 | Nagaraja et al. | |
| 8,035,708 B2 | 10/2011 | Takizawa et al. | |
| 8,134,633 B2 | 3/2012 | Watanabe | |
| 8,294,797 B2 | 10/2012 | Choe et al. | |
| 9,006,566 B2 | 4/2015 | Ihama | |
| 9,362,327 B2 | 6/2016 | Jin et al. | |
| 9,419,035 B2 * | 8/2016 | Wu | G02B 3/0018 |
| 2005/0078377 A1 * | 4/2005 | Li | B29D 11/00278 |
| | | | 359/619 |
| 2008/0204580 A1 * | 8/2008 | Holscher | H01L 21/31053 |
| | | | 348/273 |
| 2010/0327384 A1 | 12/2010 | Tomoda | |
| 2015/0372036 A1 * | 12/2015 | Suh | H01L 27/1462 |
| | | | 348/273 |
| 2016/0056193 A1 | 2/2016 | Wu et al. | |
| 2016/0358969 A1 * | 12/2016 | Fu | H01L 27/14645 |
| 2017/0053969 A1 | 2/2017 | Roh et al. | |
| 2017/0141149 A1 | 5/2017 | Lee et al. | |
| 2018/0151624 A1 * | 5/2018 | Hasegawa | H01L 27/146 |

FOREIGN PATENT DOCUMENTS

| | | |
|---|---|---|
| JP | 4546797 B2 | 9/2010 |
| JP | 2012169673 A | 9/2012 |
| JP | 2013118295 A | 6/2013 |
| KR | 20100025362 A | 3/2010 |
| KR | 20120107755 A | 10/2012 |
| KR | 2017-0022177 A | 3/2017 |

\* cited by examiner

IMAGE SENSORS AND ELECTRONIC DEVICES

CROSS-REFERENCE TO RELATED APPLICATION

This application claims priority to and the benefit of, under 35 U.S.C. § 119, Korean Patent Application No. 10-2018-0043587 filed in the Korean Intellectual Property Office on Apr. 13, 2018, the entire contents of which are incorporated herein by reference.

BACKGROUND

1. Field

Image sensors and electronic devices are disclosed.

2. Description of the Related Art

Imaging devices are used in digital cameras and camcorders, etc., to capture an image and to store it as an electrical signal, and imaging devices include one or more image sensors that may separate incident light according to a wavelength and converting each component of the separated incident light to a separate electrical signal.

SUMMARY

Some example embodiments provide image sensors having a stacking structure to provide image sensors having reduced size.

Some example embodiments provide an image sensor having improved sensitivity and color separation characteristics.

Some example embodiments provide an electronic device including the image sensor.

According to some example embodiments, an image sensor may include a photoelectric device configured to selectively absorb light associated with a first wavelength spectrum. The first wavelength spectrum may be associated with a first color of three primary colors. The image sensor may include a semiconductor substrate stacked with the photoelectric device. The semiconductor substrate may include a first photo-sensing device and a second photo-sensing device. The first photo-sensing device may be configured to sense light associated with a second wavelength spectrum. The second wavelength spectrum may be associated with a second color of the three primary colors. The second photo-sensing device may be configured to sense light associated with a third wavelength spectrum. The third wavelength spectrum may be associated with a third color of the three primary colors. The image sensor may include a first color filter corresponding to the first photo-sensing device. The first color filter may be configured to selectively transmit light associated with the first wavelength spectrum and light associated with the second wavelength spectrum. The image sensor may include a second color filter corresponding to the second photo-sensing device. The second color filter may be configured to selectively transmit light associated with the third wavelength spectrum. The first color, the second color, and the third color may be different from each other. The first photo-sensing device and the second photo-sensing device may have different thicknesses, different depths from a surface of the semiconductor substrate, or different thicknesses and different depths from the surface of the semiconductor substrate. Each photo-sensing device of the first photo-sensing device and the second photo-sensing device may include an upper surface that is proximate to the surface of the semiconductor substrate, a lower surface facing the upper surface, the lower surface distal to the surface of the semiconductor substrate, and a thickness area between the upper surface and the lower surface. At least one part of the thickness area of the first photo-sensing device may overlap at least one part of the thickness area of the second photo-sensing device in a direction extending substantially parallel to the surface of the semiconductor substrate.

A thickness of the first photo-sensing device may be smaller than or equal to a thickness of the second photo-sensing device.

The second wavelength spectrum may be a shorter wavelength spectrum than the third wavelength spectrum, and the thickness of the first photo-sensing device may be smaller than the thickness of the second photo-sensing device.

The upper surface of the first photo-sensing device and the upper surface of the second photo-sensing device may be at different depths from the surface of the semiconductor substrate, or the lower surface of the first photo-sensing device and the lower surface of the second photo-sensing device may be at different depths from the surface of the semiconductor substrate.

The second color may be blue, and the lower surface of the first photo-sensing device may be shallower from the surface of the semiconductor substrate than the lower surface of the second photo-sensing device.

The third color may be red or green, and a thickness of the first photo-sensing device may be smaller than a thickness of the second photo-sensing device.

The second color may be green, and the upper surface of the first photo-sensing device may be deeper from the surface of the semiconductor substrate than the upper surface of the second photo-sensing device.

The third color may be red or blue, and a thickness of the first photo-sensing device may be smaller than a thickness of the second photo-sensing device.

The second color may be red, and the upper surface of the first photo-sensing device may be deeper from the surface of the semiconductor substrate than the upper surface of the second photo-sensing device.

The third color may be green, and a thickness of the first photo-sensing device may be smaller than a thickness of the second photo-sensing device.

The third color may be blue, and a thickness of the first photo-sensing device may be different from a thickness of the second photo-sensing device.

The second color filter may be configured to selectively transmit light associated with the third wavelength spectrum.

The first color filter and the second color filter may be between the photoelectric device and the semiconductor substrate.

The second color filter may be configured to selectively transmit light associated with the first wavelength spectrum and the third wavelength spectrum.

The first color filter and the second color filter may be between the photoelectric device and the semiconductor substrate.

The first color filter and the second color filter may be on the photoelectric device and the semiconductor substrate, such that the photoelectric device is between the first and second color filters and the semiconductor substrate.

The image sensor may further include a focusing lens on the photoelectric device. The focusing lens may include a first focusing lens on the first photo-sensing device, and a second focusing lens on the second photo-sensing device. A thickness of the first focusing lens may be different from a thickness of the second focusing lens.

According to some example embodiments, an image sensor may include a semiconductor substrate including a first photo-sensing device and a second photo-sensing device. The first and second photo-sensing devices may be configured to sense light associated with different wavelength spectra. The different wavelength spectra may be associated with different colors of three primary colors. The image sensor may include a first color filter corresponding to the first photo-sensing device and a second color filter corresponding to the second photo-sensing device. The first color filter may be a cyan filter configured to selectively transmit light associated with blue and green wavelength spectra, a magenta filter configured to selectively transmit light associated with blue and red wavelength spectra, or a yellow filter configured to selectively transmit light associated with red and green wavelength spectra. The second color filter may be a red filter configured to selectively transmit light associated with a red wavelength spectrum, a green filter configured to selectively transmit light associated with a green wavelength spectrum, or a blue filter configured to selectively transmit light associated with a blue wavelength spectrum. The first photo-sensing device and the second photo-sensing device may have different thicknesses, different depths from a surface of the semiconductor substrate, or different thicknesses and different depths from the surface of the semiconductor substrate.

The image sensor may further include a photoelectric device stacked with the semiconductor substrate. The photoelectric device may include a pair of electrodes facing each other, and an active layer between the pair of electrodes. The active layer may be configured to selectively absorb light associated with the green wavelength spectrum, light associated with the red wavelength spectrum, or light associated with the blue wavelength spectrum.

The first color filter may be configured to selectively transmit light associated with a wavelength spectrum absorbed in the active layer.

The active layer may be configured to selectively absorb light associated with the green wavelength spectrum, the first color filter may be the cyan filter, and the second color filter may be the red filter.

The active layer may be configured to selectively absorb light associated with the green wavelength spectrum, the first color filter may be the yellow filter, and the second color filter may be the blue filter.

The active layer may be configured to selectively absorb light associated with the blue wavelength spectrum, the first color filter may be the cyan filter, and the second color filter is the red filter.

The active layer may be configured to selectively absorb light associated with the blue wavelength spectrum, the first color filter is the magenta filter, and the second color filter is the green filter.

The active layer may be configured to selectively absorb light associated with the red wavelength spectrum, the first color filter may be the magenta filter, and the second color filter may be the green filter.

The active layer may be configured to selectively absorb light associated with the red wavelength spectrum, the first color filter may be the yellow filter, and the second color filter may be the blue filter.

An electronic device may include the image sensor.

According to some example embodiments, an image sensor may include a photoelectric device configured to selectively absorb light associated with a first wavelength spectrum. The first wavelength spectrum may be associated with a first color of three primary colors. The image sensor may include a semiconductor substrate stacked with the photoelectric device. The semiconductor substrate may include first and second photo-sensing devices. The first photo-sensing device may be configured to sense light associated with a second wavelength spectrum. The second wavelength spectrum may be associated with a second color of the three primary colors. The second photo-sensing device may be configured to sense light associated with a third wavelength spectrum. The third wavelength spectrum may be associated with a third color of the three primary colors. The first color, the second color, and the third color may be different from each other. The first photo-sensing device and the second photo-sensing device may have different thicknesses, different depths from a surface of the semiconductor substrate, or different thicknesses and different depths from the surface of the semiconductor substrate.

The image sensor may further include a first color filter corresponding to the first photo-sensing device. The first color filter may be configured to selectively transmit at least light associated with the second wavelength spectrum.

The first color filter may be between the photoelectric device and the semiconductor substrate.

The photoelectric device may be between the first color filter and the semiconductor substrate.

The photoelectric device may include a first photoelectric device corresponding to the first photo-sensing device and a second photoelectric device corresponding to the second photo-sensing device. The first and second photoelectric devices may be configured to selectively absorb light associated with different wavelength spectra.

The first and second photo-sensing devices may be stacked orthogonally in the semiconductor substrate such that the first photo-sensing device is proximate to the surface of the semiconductor substrate in relation to the second photo-sensing device.

The first wavelength spectrum may be an infra-red wavelength spectrum.

DETAILED DESCRIPTION

Figure 1:
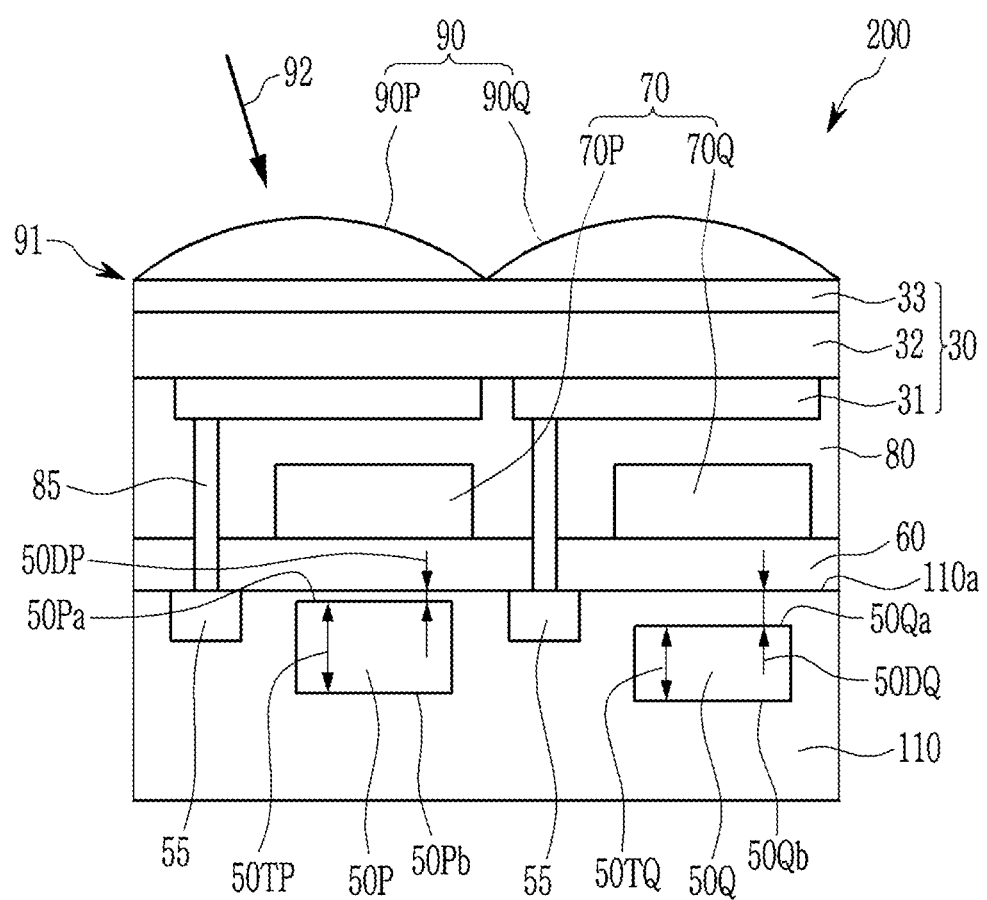
FIG. 1 is a cross-sectional view of an image sensor according to some example embodiments.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, the terms 'lower' and 'upper' are used for better understanding and ease of description, but do not limit the position relationship.

In the following descriptions, it is described that the light-receiving side is on the image sensor, but this is for the better understanding and ease of description, and does not limit the position relationship.

Hereinafter, an image sensor according to some example embodiments is described.

FIG. 1 is a cross-sectional view of an image sensor according to some example embodiments.

Referring to FIG. 1, an image sensor 200 according to some example embodiments is a stack-typed image sensor where a photoelectric device 30 and a semiconductor substrate 110 are stacked. As referred to herein, an element that is "stacked" on another element may be on the other element such that both "stacked" elements extend in parallel or substantially in parallel with each other (e.g., in parallel within manufacturing tolerances and/or material tolerances). As shown in FIG. 1, at least the photoelectric device 30 and the semiconductor substrate 110 are stacked with regard to each other.

The photoelectric device 30 may be disposed at a light-incidence side 91 (i.e., a side of the image sensor 200 that is proximate to a source of incident light 92 in relation to the semiconductor substrate 110, for example as shown in FIG. 1) and may be configured to selectively sense ("e.g., "absorb") light of ("associated with") a wavelength spectrum of a first color that is a part of a visible ray region (e.g., a first wavelength spectrum). The light of the wavelength spectrum of the first color (the first wavelength spectrum) may be one of light of three primary colors (i.e., a wavelength spectrum associated with one of three different wavelength spectra associated with three separate primary colors).

As shown in FIG. 1, the photoelectric device 30 may be between the semiconductor substrate 110 and the light-incidence side 91 of the image sensor 200. In some example embodiments, the semiconductor substrate 110 may be between the light-incidence side 91 and the photoelectric device 30, such that the photo-sensing devices 50P, 50Q are proximate to the light-incidence side 91 in relation to the photoelectric device 30.

The photoelectric device 30 includes a lower electrode 31 and an upper electrode 33 facing each other and an active layer 32 between the lower electrode 31 and the upper electrode 33.

One of the lower electrode 31 and the upper electrode 33 is an anode and the other is a cathode. Both of the lower electrode 31 and the upper electrode 33 may be a light-transmitting electrode, and the light-transmitting electrode may be made of, for example, a transparent conductor such as indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide.

The active layer 32 may be configured to selectively absorb light of a wavelength spectrum of a first color (e.g., light associated with a first wavelength spectrum). The active layer 32 may be configured to selectively absorb light of a wavelength spectrum of a first color and may transmit light except the wavelength spectrum of the first color.

The light of the wavelength spectrum of the first color ("the light associated with a first wavelength spectrum") may be red light having a maximum absorption wavelength ($\lambda_{max}$) of greater than about 600 nm and less than or equal to about 700 nm. The light of the wavelength spectrum of the first color may be for example red light having a maximum absorption wavelength ($\lambda_{max}$) in a wavelength region of about 630 nm to about 680 nm.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The light of the wavelength spectrum of the first color may be blue light having a maximum absorption wavelength ($\lambda_{max}$) in a wavelength region of greater than or equal to about 400 nm and less than about 500 nm. The light of the wavelength spectrum of the first color may be for example blue light having a maximum absorption wavelength ($\lambda_{max}$) in a wavelength region of about 420 nm to about 480 nm.

The light of the wavelength spectrum of the first color may be green light having a maximum absorption wavelength ($\lambda_{max}$) in a wavelength region of about 500 nm to about 600 nm. The light of the wavelength spectrum of the first color may be for example green light having a maximum absorption wavelength ($\lambda_{max}$) in a wavelength region of about 520 nm to about 580 nm.

The active layer 32 may include a p-type semiconductor and an n-type semiconductor and the p-type semiconductor and the n-type semiconductor may form a pn junction. The active layer 32 may be configured to selectively absorb the light of the wavelength spectrum of the first color to generate excitons, then the generated excitons may be separated into holes and electrons, and then separated holes transfer to an anode that is one of the lower electrode 31 and the upper electrode 33 and separated electrons transfer to a cathode that is one of the lower electrode 31 and the upper electrode 33 to provide a photoelectric effect. The separated electrons and/or holes may be collected in the charge storage 55.

At least one of the p-type semiconductor and the n-type semiconductor may selectively absorb the light of the wavelength spectrum of the first color. The p-type semiconductor and the n-type semiconductor may independently include an organic material, an inorganic material, or an organic/inorganic material. At least one of the p-type semiconductor and the n-type semiconductor may include an organic material.

The active layer 32 may be a single layer or a multilayer. The active layer 32 may be for example an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a volume ratio of about 1:100 to about 100:1. The p-type semiconductor and the n-type semiconductor may be mixed in a volume ratio of about 1:50 to about 50:1, about 1:10 to about 10:1, or about 1:1. When the p-type and n-type semiconductors have a composition ratio within the range, an exciton may be effectively produced and a pn junction may be effectively formed.

The p-type layer may include the p-type semiconductor, and the n-type layer may include the n-type semiconductor.

The active layer 32 may have a thickness of about 1 nm to about 500 nm. Within the range, the active layer 32 may have for example a thickness of about 5 nm to about 300 nm or about 5 nm to about 200 nm. Within the thickness range, the active layer 32 may effectively absorb the light of the wavelength spectrum of the first color, effectively separate holes from electrons, and transport them, thereby effectively improving photoelectric conversion efficiency.

The active layer 32 may be formed at the whole surface ("the entire surface") of the image sensor 200. Thereby, as the light of the wavelength spectrum of the first color may be selectively absorbed at the whole surface of the image sensor, the light area may be increased to provide high light-absorptive efficiency.

The semiconductor substrate 110 may be a silicon substrate, and is integrated with (e.g., includes) a first photo-sensing device 50P, a second photo-sensing device 50Q, a charge storage 55, and a transmission transistor (not shown). Each pixel may include the first photo-sensing device 50P or the second photo-sensing device 50Q. As shown in FIG. 1, the semiconductor substrate 110 may be "stacked" with the photoelectric device 30, such that the photoelectric device 30 is on the semiconductor substrate 110 in a direction that is orthogonal ("perpendicular") or substantially orthogonal (e.g., orthogonal within manufacturing tolerances and/or material tolerances) to an upper surface 110a of the semiconductor substrate 110.

As described herein, an element that is "on" another element may be above or beneath the other element. Additionally, an element that is on another element may be "directly" on the other element (e.g., photoelectric device 30 may be directly on the upper insulation layer 80) and/or may be "indirectly" on the other element such that one or more interposing elements and/or spaces isolate the element from direct contact with the other element (e.g., the photoelectric device 30 may be indirectly on semiconductor substrate 110 such that at least the lower insulation layer 60 interposes between the photoelectric device 30 and the semiconductor substrate 110).

The first photo-sensing device 50P and the second photo-sensing device 50Q are repetitively arranged along with a row and a column. The first photo-sensing device 50P and the second photo-sensing device 50Q may be photodiodes. The first photo-sensing device 50P and the second photo-sensing device 50Q may each sense light, and sensed information may be transferred by the transmission transistor. The charge storage 55 is electrically connected to the photoelectric device 30 and information of the charge storage 55 may be transferred by the transmission transistor.

A metal wire (not shown) and a pad (not shown) are formed under or on the first photo-sensing device 50P and the second photo-sensing device 50Q. In order to decrease signal delay, the metal wire and pad may be made of a metal having low resistivity, for example, aluminum (Al), copper (Cu), silver (Ag), and alloys thereof, but are not limited thereto.

A lower insulation layer 60 and an upper insulation layer 80 are formed on the semiconductor substrate 110. The lower insulation layer 60 and the upper insulation layer 80 may independently be made of an inorganic insulating material such as a silicon oxide and/or a silicon nitride, or a low dielectric constant (low K) material such as SiC, SiCOH, SiCO, and SiOF. The lower insulation layer 60 and the upper insulation layer 80 have a trench 85 exposing the charge storage 55. The trench 85 may be filled with fillers. At least one of the lower insulation layer 60 and the upper insulation layer 80 may be omitted.

A color filter layer 70 is formed on the semiconductor substrate 110. The color filter layer 70 may include a first color filter 70P and a second color filter 70Q that selectively transmit light of a particular (or, alternatively, predetermined) wavelength spectrum.

A plurality of the first color filters 70P and a plurality of the second color filters 70Q may form a unit color filter array, and a plurality of unit color filter arrays may be repetitively arranged along with a row and a column. The unit color filter array may for example various matrix arrangement of 2×2, 3×3, 4×4, and the like, but is not limited thereto.

The first color filter 70P may be disposed corresponding to the first photo-sensing device 50P and for example the first color filter 70P and the first photo-sensing device 50P may overlap in a vertical direction (e.g., a direction extending orthogonal or substantially orthogonal to the upper surface 110a of the semiconductor substrate 110) such that the first color filter 70P "corresponds" to the first photo-sensing device 50P. The second color filter 70Q may be disposed corresponding to the second photo-sensing device 50Q and for example the second color filter 70Q and the second photo-sensing device 50Q may overlap in a vertical direction such that the second color filter 70Q "corresponds" to the second photo-sensing device 50Q.

In the drawing, each color filter of the first color filter 70P and the second color filter 70Q is between the photoelectric device 30 and the semiconductor substrate 110, but the first color filter 70P and the second color filter 70Q may be disposed on the photoelectric device 30 and the semiconductor substrate 110, such that the color filter layer 70 is distal from the semiconductor substrate 110 in relation to the photoelectric device 30 and the photoelectric device 30 is between the color filter layer 70 (e.g., both the first and second color filters 70P, 70Q and the semiconductor substrate 110).

The first color filter 70P may be configured to selectively transmit light of wavelength spectra of plural colors of three primary colors (e.g., a mixed wavelength spectrum), and may for example be configured to selectively transmit the light of ("associated with") the wavelength spectrum of the first color that is selectively sensed (e.g., "absorbed") by the photoelectric device 30 (e.g., absorbed in the active layer 32) and light of a wavelength spectrum of a second color ("a second wavelength spectrum") that is different from the first color (e.g., light associated with a second wavelength spectrum that is associated with a second color of three primary colors, which may be different from the first wavelength spectrum of light selectively absorbed by the photoelectric device 30). That is, the first color filter 70P may be configured to selectively transmit mixed light.

The first color filter 70P may be a cyan filter configured to selectively transmit light associated with blue and green wavelength spectra, a magenta filter configured to selectively transmit light associated with blue and red wavelength spectra, or a yellow filter configured to selectively transmit light associated with red and green wavelength spectra.

The second color filter 70Q may be configured to selectively transmit light of wavelength spectra of one color or plural colors of three primary colors, and may for example be configured to selectively transmit light of a wavelength spectrum including a third color that is different from the first color and second color ("light associated with a third wavelength spectrum that is different from the first color of light selectively absorbed by the photoelectric device 30 and the second color of light"). For example, the second color filter 70Q may be configured to transmit light of a wavelength spectrum of the third color. For example, the second color filter 70Q may be configured to transmit light of ("associated with") wavelength spectra of the first color and the third color. For example, the second color filter 70Q may be configured to transmit light of wavelength spectra of the second color and the third color. For example, the second color filter 70Q may be configured to transmit light of wavelength spectra of the first color, the second color, and the third color.

The second color filter 70Q may be a red filter configured to selectively transmit light associated with a red wavelength spectrum, a green filter configured to selectively transmit light associated with a green wavelength spectrum, and a blue filter configured to selectively transmit light associated with a blue wavelength spectrum.

The second color filter 70Q may be one of a cyan filter configured to transmit light of blue and green wavelength spectra, a magenta filter configured to transmit light of blue and red wavelength spectra, and a yellow filter configured to transmit light of red and green wavelength spectra.

The first color filter 70P may be one of a cyan filter, a magenta filter, and a yellow filter and the second color filter 70Q may be one of a red filter, a green filter, and a blue filter.

The first color filter 70P and the second color filter 70Q may independently be one of a cyan filter, a magenta filter, and a yellow filter.

The first photo-sensing device 50P may be configured to sense light that is transmitted by the first color filter 70P and the second photo-sensing device 50Q may be configured to sense light that is transmitted by the second color filter 70Q. The first photo-sensing device 50P may be configured to sense light of a wavelength spectrum of a second color ("light associated with a second wavelength spectrum that is associated with a second color of three primary colors that is different from the first color of light selectively absorbed by the photoelectric device 30") that is transmitted by the first color filter 70P and the second photo-sensing device 50Q may be configured to sense light of a wavelength spectrum of a third color ("light associated with a third wavelength spectrum that is associated with a third color of three primary colors that is different from the first color of light selectively absorbed by the photoelectric device 30 and the second color of light") that is transmitted by the photoelectric device 30 and the second color filter 70Q. Accordingly, the photoelectric device 30, the first photo-sensing device 50P, and the second photo-sensing device 50Q may be configured to sense light of wavelength spectra of different colors, respectively. These three different colors sensed by the photoelectric device 30, the first photo-sensing device 50P, and the second photo-sensing device 50Q may be different primary colors of three primary colors (e.g., red, green, and blue). The first photo-sensing device 50P may be configured to selectively sense light associated with the second wavelength spectrum independently of (e.g., in the absence of) the first color filter 70P, and the second photo-sensing device 50Q may be configured to selectively sense light associated with the third wavelength spectrum independently of (e.g., in the absence of) the second color filter 70Q. Accordingly, in some example embodiments, the color filter layer 70 may be omitted from any of the example embodiments of image sensors described herein and different photo-sensing devices in some example embodiments of an image sensor may be configured to sense light associated with different particular wavelength spectra independently of (e.g., in the absence of) a color filter layer 70.

In some example embodiments, the photoelectric device 30 may be omitted from the image sensor 200. In some example embodiments, both the photoelectric device 30 and the color filter layer 70 may be omitted form the image sensor 200.

Herein, the first photo-sensing device 50P and the second photo-sensing device 50Q may have different thicknesses, different depths from the surface of the semiconductor substrate 110, or both different thicknesses and different depths from the upper surface 110a of the semiconductor substrate 110 based at least in part upon sensed wavelength spectra. In this way, by disposing of the first photo-sensing device 50P and the second photo-sensing device 50Q to have different thicknesses or the depths from the surface of the semiconductor substrate 110, color separation characteristics may be improved without mixing of wavelength spectra respectively sensed by the first photo-sensing device 50P and the second photo-sensing device 50Q. Thereby, a crosstalk of an image sensor 200 may be reduced.

The thickness 50TP of the first photo-sensing device 50P may be smaller than or equal to the thickness 50TQ of the second photo-sensing device 50Q.

In some example embodiments, based on the wavelength spectrum of the second color being a shorter wavelength spectrum than the wavelength spectrum of the third color, the thickness 50TP of the first photo-sensing device 50P may be smaller than or equal to the thickness 50TQ of the second photo-sensing device 50Q. In some example embodiments, based on the wavelength spectrum of the second color being a longer wavelength spectrum than the wavelength spectrum of the third color, the thickness 50TP of the first photo-sensing device 50P may be smaller than or equal to the thickness 50TQ of the second photo-sensing device 50Q. In some example embodiments, based on the second color being blue and the third color being green or red, the thickness 50TP of the first photo-sensing device 50P may be smaller than or equal to the thickness 50TQ of the second photo-sensing device 50Q. In some example embodiments, based on the second color being green and the third color being red, the thickness 50TP of the first photo-sensing device 50P may be smaller than or equal to the thickness 50TQ of the second photo-sensing device 50Q. In some example embodiments, based on the second color being green and the third color being blue, the thickness 50TP of the first photo-sensing device 50P may be smaller than or equal to the thickness 50TQ of the second photo-sensing device 50Q. In some example embodiments, based on the second color being red and the third color being green, the thickness 50TP of the first photo-sensing device 50P may be smaller than or equal to the thickness 50TQ of the second photo-sensing device 50Q. In some example embodiments, based on the second color being red and the third color being blue, the thickness 50TP of the first photo-sensing device 50P may be different from the thickness 50TQ of the second photo-sensing device 50Q.

The thickness 50TP of the first photo-sensing device 50P may be larger than or equal to the thickness 50TQ of the second photo-sensing device 50Q.

The depth 50DP of the first photo-sensing device 50P from the upper surface 110a of the semiconductor substrate 110 (e.g., the distance of the upper surface 50Pa of the first photo-sensing device 50P from the upper surface 110a of the semiconductor substrate 110) may be different from the depth 50DQ of the second photo-sensing device 50Q from the upper surface 110a of the semiconductor substrate 110 (e.g., the distance of the upper surface 50Qa of the second photo-sensing device 50Q from the upper surface 110a of the semiconductor substrate 110).

In some example embodiments, when each of the first photo-sensing device 50P and the second photo-sensing device 50Q having an upper surface 50Pa, 50Qa near ("proximate") to the upper surface 110a of the semiconductor substrate 110, a lower surface 50Pb, 50Qb facing the upper surface 50Pa, 50Qa (e.g., distal to the upper surface 110a of the semiconductor substrate 110) and a thickness area between the upper surface 50Pa, 50Qa and the lower surface 50Pb, 50Qb, the upper surface 50Pa of the first photo-sensing device 50P and the upper surface 50Qa of the second photo-sensing device 50Q may be disposed at different depths 50DP, 50DQ from the upper surface 110a of the semiconductor substrate 110. For example, when the second color is green and the third color is red or blue, the upper surface 50Pa of the first photo-sensing device 50P may be disposed deeper from the upper surface 110a of the semiconductor substrate 110 than the upper surface 50Qa of the second photo-sensing device 50Q. In another example, when the second color is red and the third color is blue or green, the upper surface 50Pa of the first photo-sensing device 50P may be disposed deeper from the upper surface 110a of the semiconductor substrate 110 than the upper surface 50Qa of the second photo-sensing device 50Q.

In some example embodiments, when each of the first photo-sensing device 50P and the second photo-sensing device 50Q has an upper surface 50Pa, 50Qa near to the upper surface 110a, a lower surface 50Pb, 50Qb facing the upper surface 50Pa, 50Qa, and a thickness area between the upper surface 50Pa, 50Qa and the lower surface 50Pb, 50Qb, the lower surface 50Pb, 50Qb of the first photo-sensing device 50P and the lower surface of the second photo-sensing device 50Q may be disposed at different depths from the upper surface 110a of the semiconductor substrate 110. For example, when the second color is blue and the third color is green or red, the lower surface 50Pb of the first photo-sensing device 50P may be disposed shallower from the upper surface 110a of the semiconductor substrate 110 than the lower surface 50Qb of the second photo-sensing device 50Q, and the thickness 50TP of the first photo-sensing device 50P may be smaller than the thickness 50TQ of the second photo-sensing device 50Q.

The depth 50DP of the first photo-sensing device 50P from the upper surface 110a of the semiconductor substrate 110 may be larger than the depth 50DQ of the second photo-sensing device 50Q from the upper surface 110a of the semiconductor substrate 110.

The depth 50DP of the first photo-sensing device 50P from the upper surface 110a of the semiconductor substrate 110 may be shallower than the depth 50DQ of the second photo-sensing device 50Q from the upper surface 110a of the semiconductor substrate 110.

In some example embodiments, including the example embodiments shown in FIG. 1, when each of the first photo-sensing device 50P and the second photo-sensing device 50Q has an upper surface 50Pa, 50Qa near to the upper surface 110a of the semiconductor substrate 110, a lower surface 50Pb, 50Qb facing the upper surface 50Pa, 50Qa and a thickness area between the upper surface 50Pa, 50Qa and the lower surface 50Pb, 50Qb, at least one part of the thickness area 50TP of the first photo-sensing device 50P may overlap to at least one part of the thickness area 50TQ of the second photo-sensing device 50Q along a parallel direction that extends parallel or substantially parallel (e.g., parallel within manufacturing tolerances and/or material tolerances) to the upper surface 110a of the semiconductor substrate 110.

FIGS. 2, 3, 4, 5, 6, and 7 are cross-sectional views showing embodiments of the image sensor of FIG. 1 according to some example embodiments.

In FIGS. 2 to 7, 'B', 'G,' and 'R' of the reference numerals may refer to blue, green, and red, respectively and 'C', 'Y,' and 'M' of the reference numerals may refer to cyan, yellow, and magenta, respectively.

Figure 2:
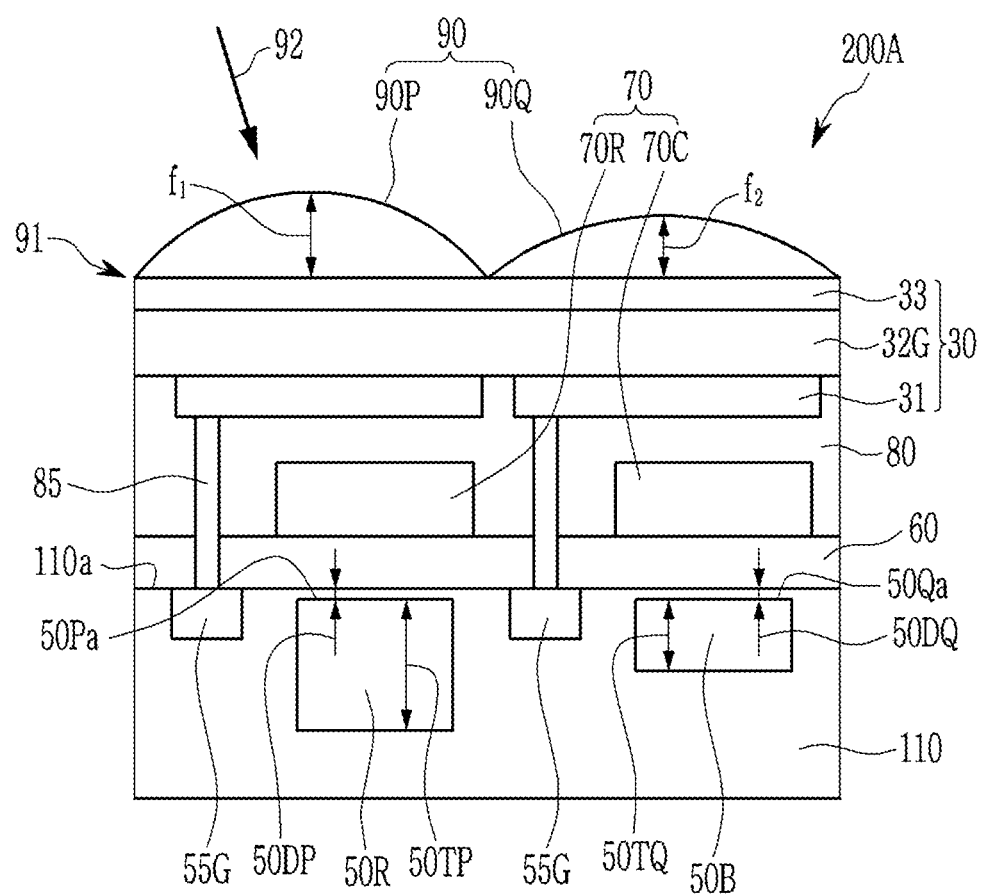
FIGS. 2, 3, 4, 5, 6, and 7 are cross-sectional views showing embodiments of the image sensor of FIG. 1 according to some example embodiments.

Referring to FIG. 2, in an image sensor 200A according to some example embodiments, the first color may be green, the second color may be blue, and the third color may be red. That is, an active layer 32G may be configured to selectively absorb light of a green wavelength spectrum, the first color filter 70P may be a cyan filter 70C configured to transmit light of green and blue wavelength spectra, and the second color filter 70Q may be a red filter 70R. Accordingly, the photoelectric device 30 may be a green photoelectric device, the first photo-sensing device 50P may be a blue sensing device 50B, and the second photo-sensing device 50Q may be a red sensing device 50R.

Figure 3:
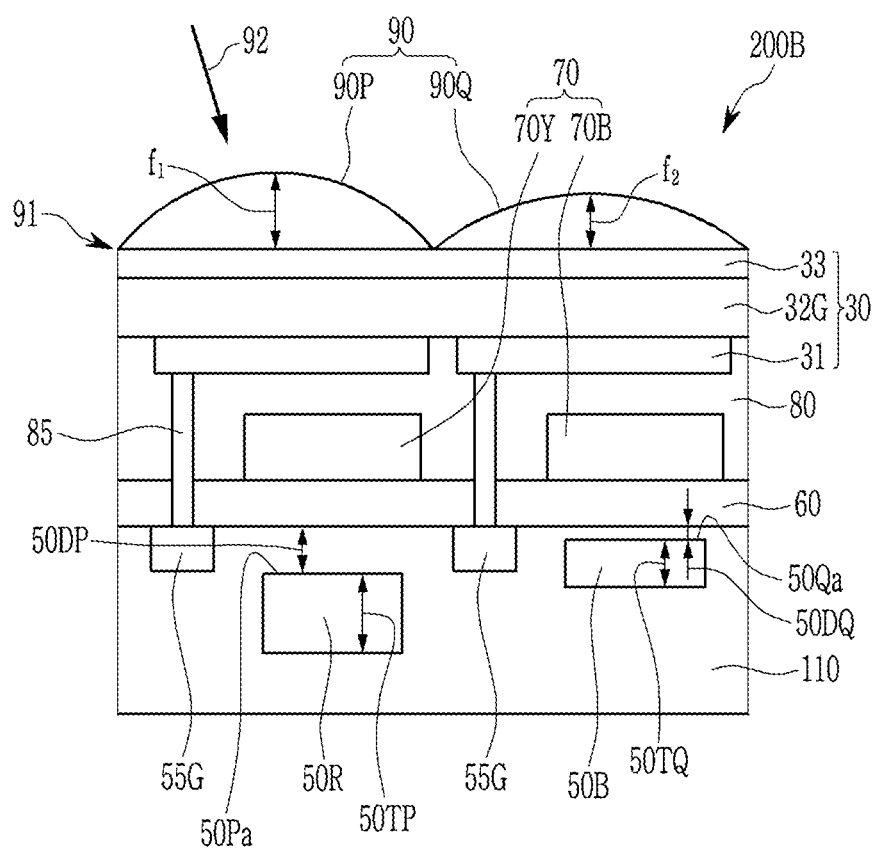

Referring to FIG. 3, in an image sensor 200B according to some example embodiments, the first color may be green, the second color may be red, and the third color may be blue. That is, an active layer 32G may be configured to selectively absorb light of a green wavelength spectrum, the first color filter 70P may be a yellow filter 70Y configured to transmit light of green and red wavelength spectra, and the second color filter 70Q may be a blue filter 70B. Accordingly, the photoelectric device 30 may be a green photoelectric device, the first photo-sensing device 50P may be a red sensing device 50R, and the second photo-sensing device 50Q may be a blue sensing device 50B.

Figure 4:
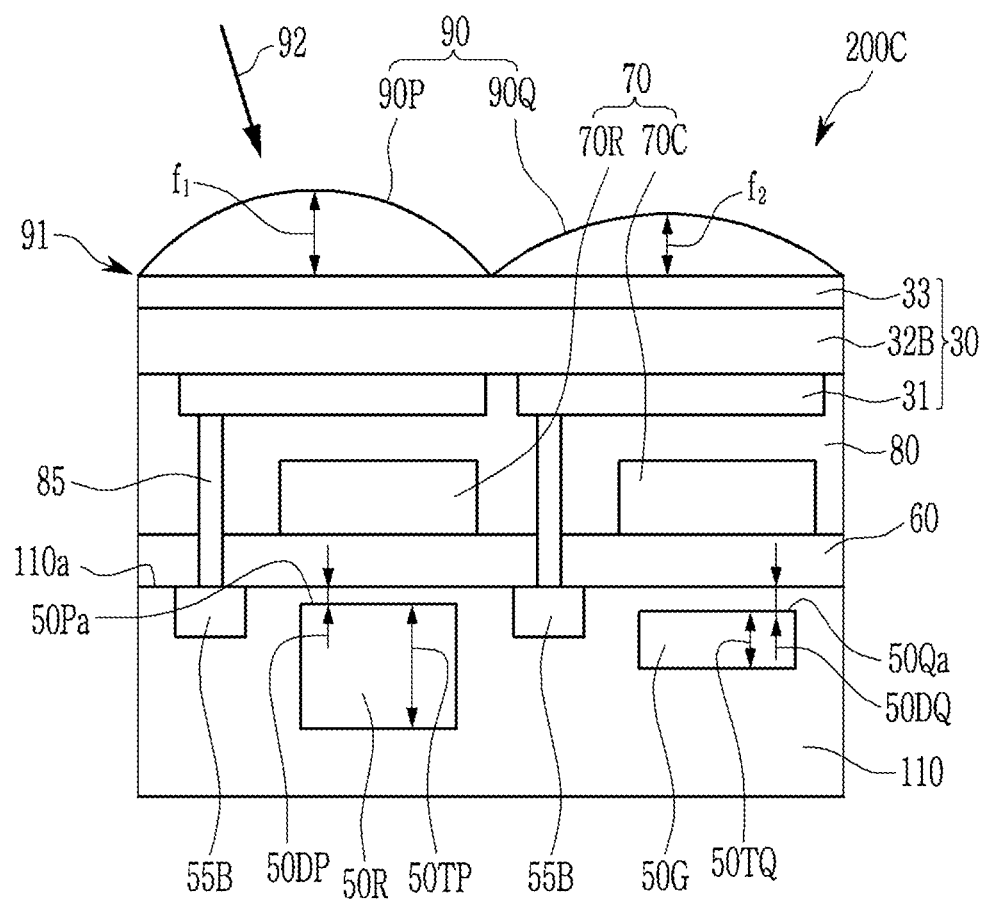

Referring to FIG. 4, in an image sensor 200C according to some example embodiments, the first color may be blue, the second color may be green, and the third color may be red. That is, an active layer 32B may be configured to selectively absorb light of a blue wavelength spectrum, the first color filter 70P may be a cyan filter 70C configured to transmit light of blue and green wavelength spectra, the second color filter 70Q may be a red filter 70R. Accordingly, the photoelectric device 30 may be a blue photoelectric device, the first photo-sensing device 50P may be a green sensing device 50G, and the second photo-sensing device 50Q may be a red sensing device 50R.

Figure 5:
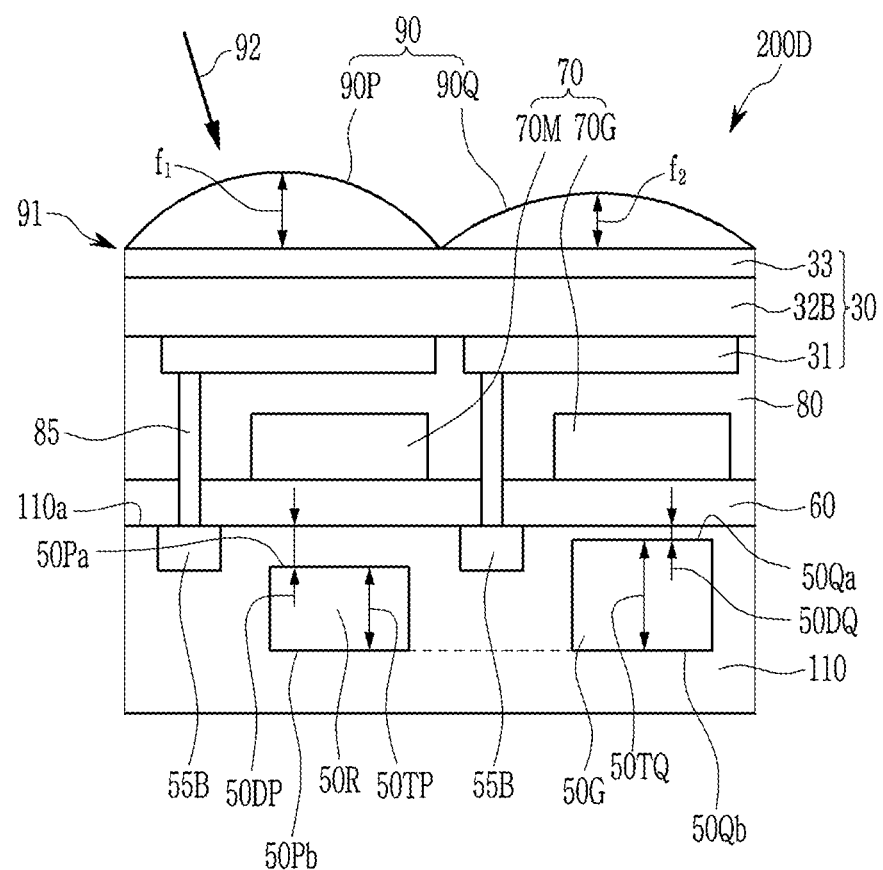

Referring to FIG. 5, in an image sensor 200D according to some example embodiments, the first color may be blue, the second color may be red, and the third color may be green. That is, an active layer 32B may be configured to selectively absorb light of a blue wavelength spectrum, the first color filter 70P may be a magenta filter 70M configured to transmit light of blue and red wavelength spectra, and the second color filter 70Q may be a green filter 70G. Accordingly, the photoelectric device 30 may be a blue photoelectric device, the first photo-sensing device 50P may be a red sensing device 50R and the second photo-sensing device 50Q may be a green sensing device 50G.

In some example embodiments, including the example embodiments shown in FIG. 5, the lower surfaces 50Pb, 50Qb of the first and second photo-sensing devices 50P, 50Q may be equal or substantially equal in depth (e.g., equal in depth within manufacturing tolerances and/or material tolerances) from the upper surface 110a of the semiconductor substrate 110.

In some example embodiments, the upper surfaces 50Pa, 50Qa of the first and second photo-sensing devices 50P, 50Q may be equal or substantially equal in depth from the upper surface 110a of the semiconductor substrate 110.

Figure 6:
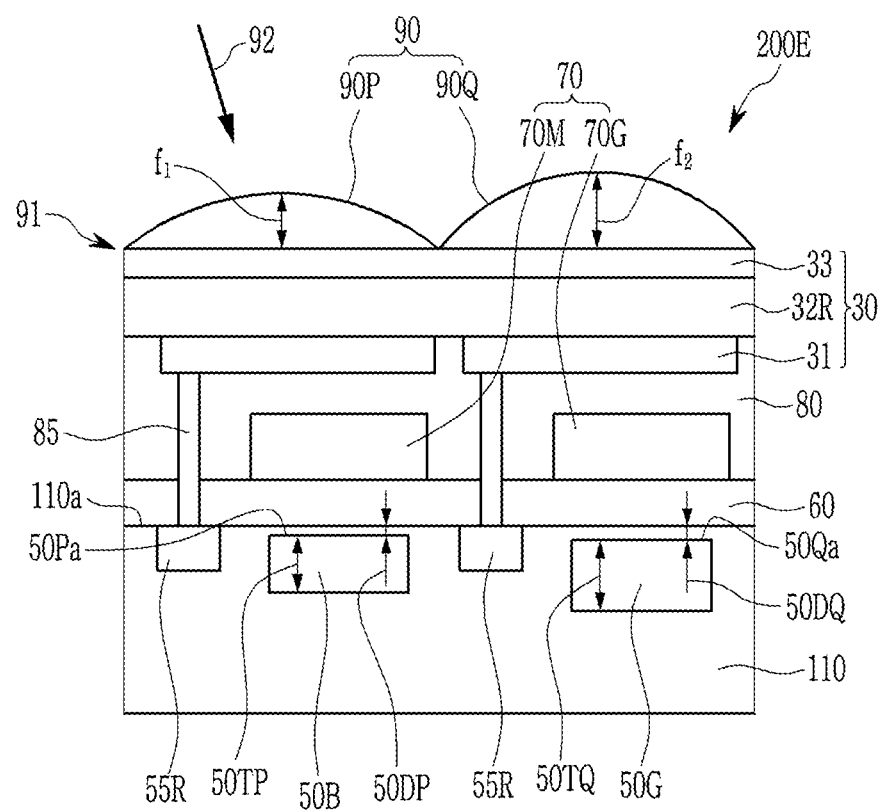

Referring to FIG. 6, in an image sensor 200E according to some example embodiments, the first color may be red, the second color may be blue, and the third color may be green. That is, an active layer 32R may be configured to selectively absorb light of a red wavelength spectrum, the first color filter 70P may be a magenta filter 70M configured to transmit light of red and blue wavelength spectra, and the second color filter 70Q may be a green filter 70G. Accordingly, the photoelectric device 30 may be a red photoelectric device, the first photo-sensing device 50P may be a blue sensing device 50B, and the second photo-sensing device 50Q may be a green sensing device 50G.

Figure 7:
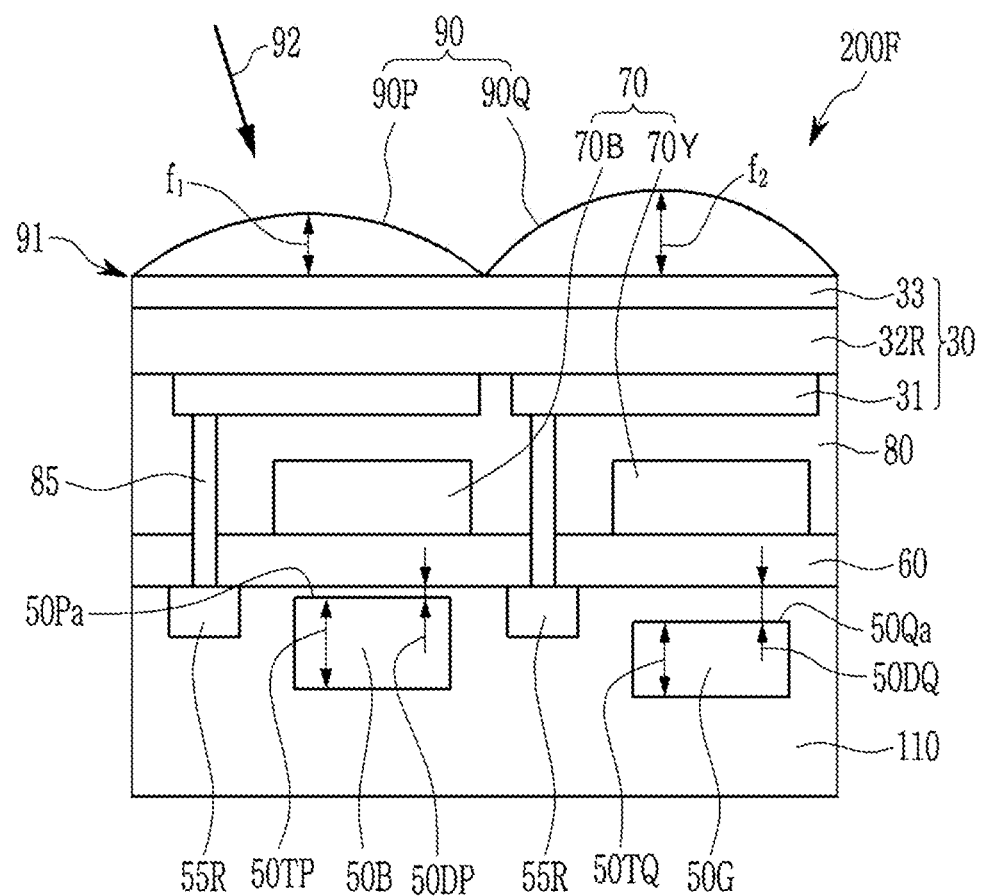

Referring to FIG. 7, in an image sensor 200F according to some example embodiments, the first color may be red, the second color may be green, and the third color may be blue. That is, an active layer 32R may be configured to selectively absorb light of a red wavelength spectrum, the first color filter 70P may be a yellow filter 70Y configured to transmit light of red and green wavelength spectra and the second color filter 70Q may be a blue filter 70B. Accordingly, the photoelectric device 30 may be a red photoelectric device, the first photo-sensing device 50P may be a green sensing device 50G, and the second photo-sensing device 50Q may be a blue sensing device 50B.

The image sensor may further include a focusing lens 90. The focusing lens 90 may control a direction of incident light and gather the light in one region. The focusing lens 90 may have a shape of, for example, a cylinder or a hemisphere, but is not limited thereto. As shown in at least FIGS. 1-7, the focusing lens 90 may be on the photoelectric device 30.

For example, as shown in at least FIG. 1, the focusing lens 90 may be disposed in each pixel, and for example the focusing lens 90 may include a first focusing lens 90P on the upper surface of the first photo-sensing device 50P and a second focusing lens 90Q on the upper surface of the second photo-sensing device 50Q.

Herein, the first focusing lens 90P and the second focusing lens 90Q may have different shapes and/or thicknesses. As shown in at least FIGS. 2 and 3, the thickness $t_1$ of the first focusing lens 90P may be greater than the thickness $t_2$ of the second focusing lens 90Q.

The shapes and/or thicknesses of the first focusing lens 90P and the second focusing lens 90Q may be different according to wavelength spectra sensed in the first photo-sensing device 50P and the second photo-sensing device 50Q. For example, a first focusing lens 90P of a pixel including a first photo-sensing device 50P sensing light of a wavelength spectrum in a long wavelength region may be thicker than a second focusing lens 90Q of a pixel including a second photo-sensing device 50Q sensing light of a wavelength spectrum in a short wavelength region. For example, a second focusing lens 90Q of a pixel including a second photo-sensing device 50Q sensing light of a wavelength spectrum in a long wavelength region may be thicker than a first focusing lens 90P of a pixel including a first photo-sensing device 50P sensing light of a wavelength spectrum in a short wavelength region. For example, when a blue photo-sensing device and a red photo-sensing device are repetitively arranged along with a row and a column, a focusing lens 90 of a pixel including the red photo-sensing device may have a larger thickness than a focusing lens 90 of a pixel including the blue photo-sensing device, but is not limited thereto.

An image sensor according to some example embodiments has a structure that the photo-sensing device and the photoelectric device are stacked and thus may have a reduced area and be down-sized. In addition, an image sensor according to some example embodiments may decrease a light loss by the color filter and increase sensitivity by including a color filter transmitting mixed light. In addition, an image sensor according to some example embodiments may improve color separation characteristics by differing the thickness and depth of the photo-sensing devices in the semiconductor substrate. Accordingly, a highly sensitive image sensor having improved color separation characteristics may be realized.

The aforementioned image sensor may be respectively applied to various electronic devices, which include, for example, a camera, a camcorder, and a mobile phone internally having them, a display device, a security system, a medical device, or the like is not limited thereto.

Figure 8:
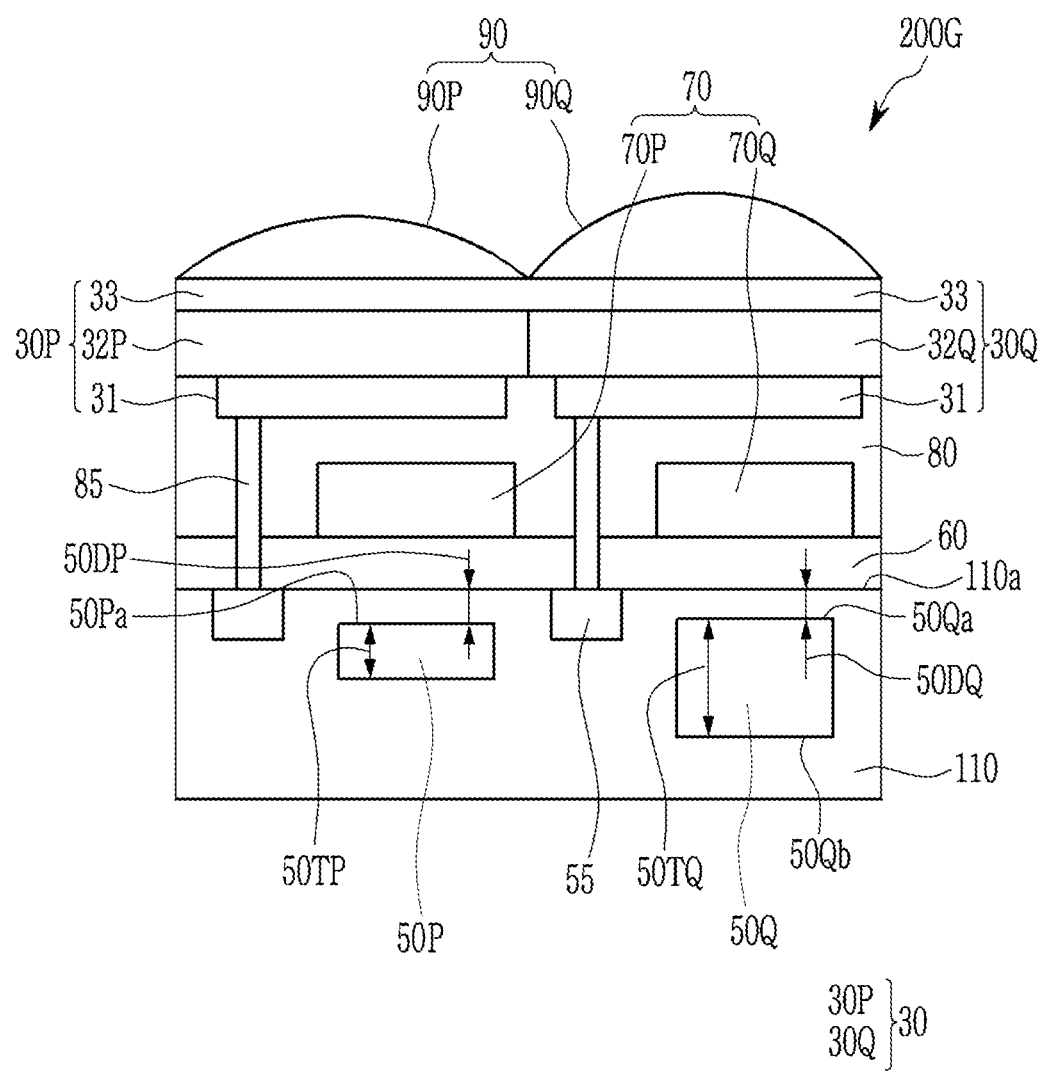
FIG. 8 is a schematic cross-sectional view showing an image sensor according to some example embodiments.

FIG. 8 is a schematic cross-sectional view showing an image sensor according to some example embodiments.

As shown with reference to FIG. 8, an image sensor 200G may include a plurality of photoelectric devices 30P, 30Q on a semiconductor substrate 110, where the plurality of photoelectric devices 30P, 30Q are configured to convert light associated with different wavelength spectra (e.g., different colors of blue light, green light, or red light) into electric signals, respectively. As shown, the first photoelectric device 30P includes a first active layer 32P and the second photoelectric device 30Q includes a second active layer 32Q that is different from the first active layer 32P, such that the first and second photoelectric devices 30P, 30Q are configured to selectively absorb light associated with different wavelength spectra (e.g., different colors). As further shown, the first and second photoelectric devices 30P, 30Q may be at a common distance from the semiconductor substrate 110, such that the first and second photoelectric devices 30P, 30Q collectively establish a photoelectric device 30 having a flush or substantially flush (e.g., flush within manufacturing tolerances and/or material tolerances) upper surface, as shown in at least FIG. 8.

The first photoelectric device 30P may be configured to selectively absorb light associated with a first color and the second photoelectric device 30Q may be configured to selectively absorb light associated with a second color, while the first photo-sensing device 50P may be configured to sense light associated with a third color and the second photo-sensing device 50Q may be configured to sense light associated with a fourth color.

In some example embodiments, the second photo-sensing device 50Q may be omitted from the image sensor 200G, and the second photoelectric device 30Q may be configured to selectively absorb light in a non-visible wavelength spectrum, including near infra-red light, far infra-red light, ultra-violet light, a sub-combination thereof, or a combination thereof. For example, the second photoelectric device 30Q may selectively absorb light in ("associated with") an infra-red wavelength spectrum of greater than or equal to about 700 nm and less than or equal to about 1300 nm without absorption.

Figure 9:
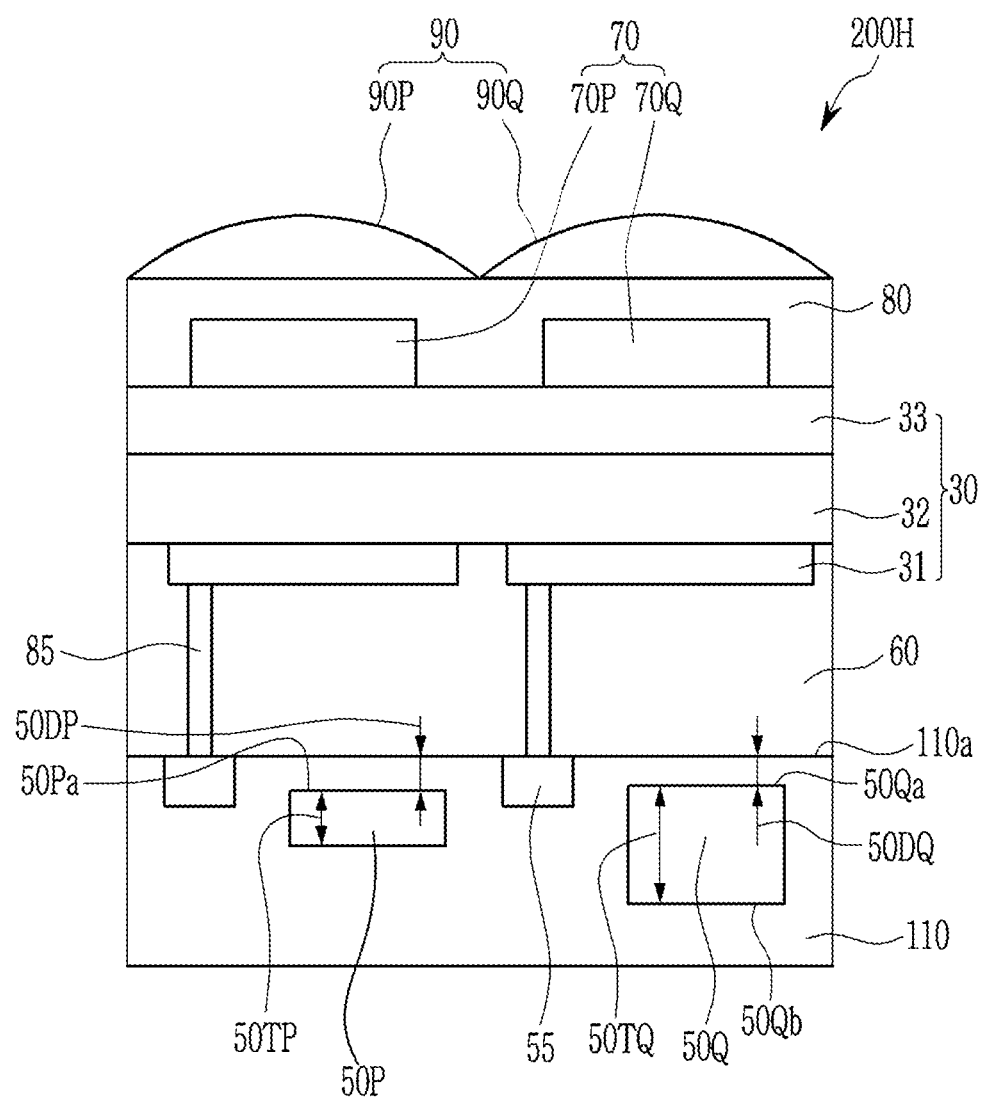
FIG. 9 is a schematic cross-sectional view showing an image sensor according to some example embodiments.

FIG. 9 is a schematic cross-sectional view showing an image sensor according to some example embodiments.

Referring to FIG. 9, in some example embodiments, an image sensor 200H may include the color filter layer 70 and the upper insulation layer 80 as being distal from the semiconductor substrate 110 in relation to the photoelectric device 30, such that the photoelectric device 30 is between the first and second color filters 70P, 70Q and the semiconductor substrate 110. In some example embodiments, each color filter 70P, 70Q may selectively transmit mixed light that includes both light associated with the first color (which the photoelectric device 30 is configured to selectively absorb) and light associated with the respective photo-sensing device 50P, 50Q over which the respective color filter 70P, 70Q is vertically overlapping. For example, in FIG. 9, the photoelectric device 30 may selectively absorb green light, the first and second photo-sensing devices 50P, 50Q may sense red light and blue light, respectively, and the first and second color filters 70P, 70Q may selectively transmit yellow light and cyan light, respectively.

In some example embodiments, an image sensor may include multiple photoelectric devices that are vertically stacked on each other (e.g., stacked in a vertical direction), where the multiple photoelectric devices may selectively absorb light associated with different wavelength spectra. For example, image sensor 200 as shown in FIG. 1 may include an additional photoelectric device that may selectively absorb light associated with an infra-red wavelength spectrum, where the additional photoelectric device is stacked on the photoelectric device 30, such that the additional photoelectric device is either between photoelectric device 30 and the semiconductor substrate 110 (e.g., is directly between the photoelectric device 30 and the upper insulation layer 80) or is distal to the semiconductor substrate 110 in relation to the photoelectric device 30 (e.g., is directly between the photoelectric device 30 and the focusing lens 90). In some example embodiments, image sensor 200 may include a photoelectric device 30 and no additional photoelectric device, where the photoelectric device 30 is configured to selectively absorb light associated with a first wavelength spectrum that is an infra-red wavelength spectrum (e.g., infra-red light).

Figure 10:
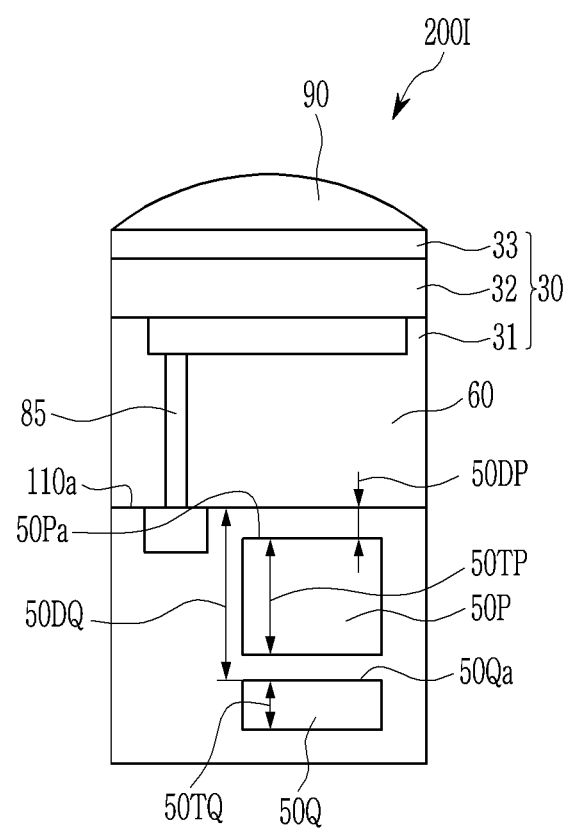
FIG. 10 is a schematic cross-sectional view of an image sensor according to some example embodiments.

FIG. 10 is a schematic cross-sectional view of an image sensor according to some example embodiments.

In the image sensor 200I of FIG. 10, the first photo-sensing device 50P and the second photo-sensing device 50Q are stacked, within the semiconductor substrate 110, orthogonally in relation to the upper surface 110a of the semiconductor substrate 110, such that the upper surface 50Pa of the first photo-sensing device 50P is proximate to the upper surface 110a of the semiconductor substrate 110 in relation to the upper surface 50Qa of the second photo-sensing device 50Q, where the first and second photo-sensing devices 50P, 50Q vertically overlap (e.g., overlap in the vertical direction). As shown, the first and second photo-sensing devices 50P, 50Q may have different respective thicknesses 50TP, 50TQ. In some example embodiments, the first photo-sensing device 50P may sense light associated with a shorter wavelength spectrum than the second photo-sensing device 50Q, based on the first photo-sensing device 50P being proximate to the upper surface 110a of the semiconductor substrate 110, and thus proximate to the light incident side of the image sensor 200I, in relation to the second photo-sensing device 50Q. For example, where the photoelectric device 30 is configured to selectively absorb green light, the first photo-sensing device 50P may sense blue light and the second photo-sensing device 50Q may sense red light.

Figure 11:
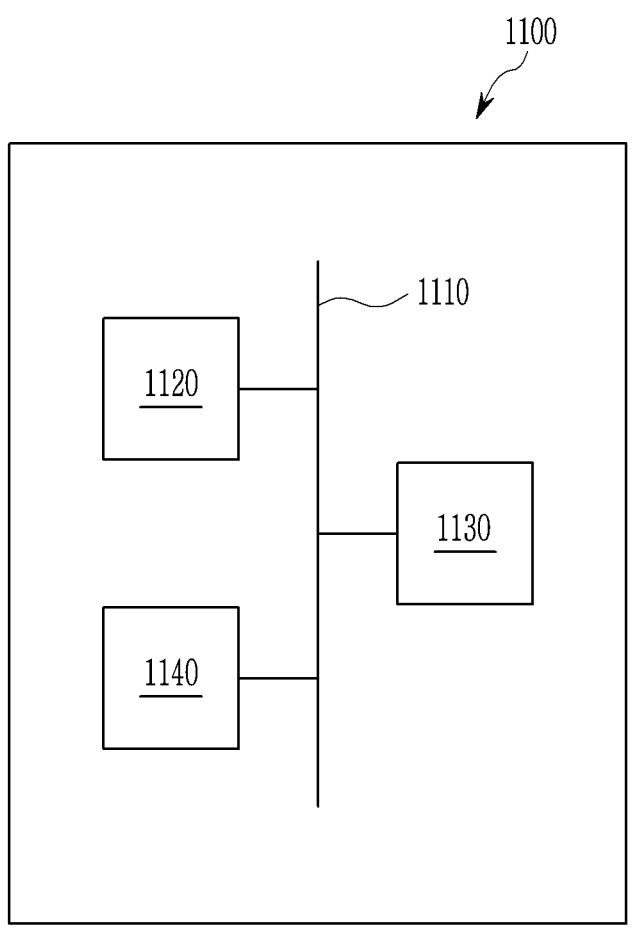
FIG. 11 is a schematic diagram of an electronic device according to some example embodiments.

FIG. 11 is a schematic diagram of an electronic device 1100 according to some example embodiments.

As shown in FIG. 11, an electronic device 1100 may include a processor 1120, a memory 1130, and an image sensor 1140 that are electrically coupled together via a bus 1110. The image sensor 1140 may be an image sensor of any of the example embodiments as described herein. The memory 1130, which may be a non-transitory computer readable medium, may store a program of instructions. The processor 1120 may execute the stored program of instructions to perform one or more functions. For example, the processor 1120 may be configured to process electric signals generated by the image sensor 1140. The processor 1120 may be configured to generate an output (e.g., an image to be displayed on a display interface) based on processing the electric signals.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

What is claimed is:

1. An image sensor including a plurality of pixels including a first pixel and a second pixel adjacent to each other, the image sensor comprising:
    a photoelectric device configured to selectively absorb light associated with a first wavelength spectrum, the first wavelength spectrum associated with a first color of three primary colors;
    a semiconductor substrate stacked with the photoelectric device, the semiconductor substrate including a plurality of photo-sensing devices, a photo-sensing device in the first pixel being different from a photo-sensing device in the second pixel, the plurality of photo-sensing devices including
        a first photo-sensing device positioned in the first pixel and configured to sense light associated with a second wavelength spectrum, the second wavelength spectrum associated with a second color of the three primary colors, and
        a second photo-sensing device positioned in the second pixel and configured to sense light associated with a third wavelength spectrum, the third wavelength spectrum associated with a third color of the three primary colors;
    a first color filter corresponding to the first photo-sensing device, the first color filter configured to selectively transmit light associated with the first wavelength spectrum and light associated with the second wavelength spectrum; and
    a second color filter corresponding to the second photo-sensing device, the second color filter configured to selectively transmit light associated with the third wavelength spectrum,
    wherein the first color, the second color, and the third color are different from each other,
    wherein the first photo-sensing device and the second photo-sensing device have different thicknesses, different depths from a surface of the semiconductor substrate, or different thicknesses and different depths from the surface of the semiconductor substrate,
    wherein each photo-sensing device of the first photo-sensing device and the second photo-sensing device includes
        an upper surface that is proximate to the surface of the semiconductor substrate,
        a lower surface facing the upper surface, the lower surface distal to the surface of the semiconductor substrate, and
        a thickness area between the upper surface and the lower surface, and wherein at least one part of the thickness area of the first photo-sensing device overlaps at least one part of the thickness area of the second photo-sensing device in a direction extending substantially parallel to the surface of the semiconductor substrate.

2. The image sensor of claim 1, wherein a thickness of the first photo-sensing device is smaller than or equal to a thickness of the second photo-sensing device.

3. The image sensor of claim 2, wherein
the second wavelength spectrum is a shorter wavelength spectrum than the third wavelength spectrum, and
the thickness of the first photo-sensing device is smaller than the thickness of the second photo-sensing device.

4. The image sensor of claim 1, wherein
the upper surface of the first photo-sensing device and the upper surface of the second photo-sensing device are at different depths from the surface of the semiconductor substrate, or
the lower surface of the first photo-sensing device and the lower surface of the second photo-sensing device are at different depths from the surface of the semiconductor substrate.

5. The image sensor of claim 4, wherein
the second color is blue, and
the lower surface of the first photo-sensing device is shallower from the surface of the semiconductor substrate than the lower surface of the second photo-sensing device.

6. The image sensor of claim 5, wherein
the third color is red or green, and
a thickness of the first photo-sensing device is maller than a thickness of the second photo-sensing device.

7. The image sensor of claim 4, wherein
the second color is green, and
the upper surface of the first photo-sensing device is deeper from the surface of the semiconductor substrate than the upper surface of the second photo-sening device.

8. The image sensor of claim 7, wherein
the third color is red or blue, and
a thickness of the first photo-sensing device is smaller than a thickness of the second photo-sensing device.

9. The image sensor of claim 4, wherein
the second color is red, and
the upper surface of the first photo-sensing device is deeper from the surface of the semiconductor substrate than the upper surface of the second photo-sensing device.

10. The image sensor of claim 9, wherein
the third color is green, and
a thickness of the first photo-sensing device is smaller than a thickness of the second photo-sensing device.

11. The image sensor of claim 9, wherein
the third color is blue, and
a thickness of the first photo-sensing device is different from a thickness of the second photo-sensing device.

12. The image sensor of claim 1, wherein the second color filter is configured to selectively transmit light associated with the third wavelength spectrum.

13. The image sensor of claim 12, wherein the first color filter and the second color filter are between the photoelectric device and the semiconductor substrate.

14. The image sensor of claim 1, wherein the second color filter is configured to selectively transmit light associated with the first wavelength spectrum and the third wavelength spectrum.

15. The image sensor of claim 14, wherein the first color filter and the second color filter are between the photoelectric device and the semiconductor substrate.

16. The image sensor of claim 14, wherein the first color filter and the second color filter are on the photoelectric device and the semiconductor substrate, such that the photoelectric device is between the first and second color filters and the semiconductor substrate.

17. The image sensor of claim 1, further comprising:
a focusing lens on the photoelectric device, the focusing lens including
a first focusing lens on the first photo-sensing device, and
a second focusing lens on the second photo-sensing device,
wherein a thickness of the first focusing lens is different from a thickness of the second focusing lens.

18. An image sensor including a plurality of pixels including a first pixel and a second pixel adjacent to each other, the image sensor comprising:
a semiconductor substrate including a plurality of photo-sensing devices, a photo-sensing device in the first pixel being different from a photo-sensing device in the second pixel, the plurality of photo-sensing devices including a first photo-sensing device in the first pixel and a second photo-sensing device in the second pixel, the first and second photo-sensing devices configured to sense light associated with different wavelength spectra, the different wavelength spectra associated with different colors of three primary colors;
a first color filter corresponding to the first photo-sensing device; and
a second color filter corresponding to the second photo-sensing device,
wherein the first color filter is
a cyan filter configured to selectively transmit light associated with blue and green wavelength spectra,
a magenta filter configured to selectively transmit light associated with blue and red wavelength spectra, or
a yellow filter configured to selectively transmit light associated with red and green wavelength spectra,
wherein the second color filter is a red filter configured to selectively transmit light associated with a red wavelength spectrum,
a green filter configured to selectively transmit light associated with a green wavelength spectrum, or
a blue filter configured to selectively transmit light associated with a blue wavelength spectrum, and
wherein the first photo-sensing device and the second photo-sensing device have different thicknesses, different depths from a surface of the semiconductor substrate, or different thicknesses and different depths from the surface of the semiconductor substrate.

19. The image sensor of claim 18, further comprising:
a photoelectric device stacked with the semiconductor substrate,
wherein the photoelectric device includes
a pair of electrodes facing each other, and
an active layer between the pair of electrodes, the active layer configured to selectively absorb light associated with the green wavelength spectrum, light associated with the red wavelength spectrum, or light associated with the blue wavelength spectrum.

20. The image sensor of claim 19, wherein the first color filter is configured to selectively transmit light associated with a wavelength spectrum absorbed in the active layer.

21. The image sensor of claim 19, wherein
the active layer is configured to selectively absorb light associated with the green wavelength spectrum,
the first color filter is the cyan filter, and
the second color filter is the red filter.

22. The image sensor of claim 19, wherein
the active layer is configured to selectively absorb light associated with the green wavelength spectrum,
the first color filter is the yellow filter, and
the second color filter is the blue filter.

23. The image sensor of claim 19, wherein
the active layer is configured to selectively absorb light associated with the blue wavelength spectrum,
the first color filter is the cyan filter, and
the second color filter is the red filter.

24. The image sensor of claim 19, wherein
the active layer is configured to selectively absorb light associated with the blue wavelength spectrum,
the first color filter is the magenta filter, and
the second color filter is the green filter.

25. The image sensor of claim 19, wherein
the active layer is configured to selectively absorb light associated with the red wavelength spectrum,
the first color filter is the magenta filter, and
the second color filter is the green filter.

26. The image sensor of claim 19, wherein
the active layer is configured to selectively absorb light associated with the red wavelength spectrum,
the first color filter is the yellow filter, and
the second color filter is the blue filter.

27. An electronic device comprising the image sensor of claim 1.

28. An electronic device comprising the image sensor of claim 18.

29. An image sensor including a plurality of pixels including a first pixel and a second pixel adjacent to each other, the image sensor comprising:
a photoelectric device configured to selectively absorb light associated with a first wavelength spectrum, the first wavelength spectrum associated with a first color of three primary colors,
a semiconductor substrate stacked with the photoelectric device, the semiconductor substrate including a plurality of photo-sensing devices, a photo-sensing device in the first pixel being different from a photo-sensing device in the second pixel, the plurality of photo-sensing devices including
a first photo-sensing device positioned in the first pixel and configured to sense light associated with a second wavelength spectrum, the second wavelength spectrum associated with a second color of the three primary colors, and
a second photo-sensing device positioned in the second pixel and configured to sense light associated with a third wavelength spectrum, the third wavelength spectrum associated with a third color of the three primary colors,
wherein the first color, the second color, and the third color are different from each other,
wherein the first photo-sensing device and the second photo-sensing device have different thicknesses, different depths from a surface of the semiconductor substrate, or different thicknesses and different depths from the surface of the semiconductor substrate.

30. The image sensor of claim 29, further comprising:
a first color filter corresponding to the first photo-sensing device, the first color filter configured to selectively transmit at least light associated with the second wavelength spectrum.

31. The image sensor of claim 30, wherein the first color filter is between the photoelectric device and the semiconductor substrate.

32. The image sensor of claim 30, wherein the photoelectric device is between the first color filter and the semiconductor substrate.

33. The image sensor of claim 29, wherein the photoelectric device includes
a first photoelectric device corresponding to the first photo-sensing device, and
a second photoelectric device corresponding to the second photo-sensing device, the first and second photoelectric devices configured to selectively absorb light associated with different wavelength spectra.

34. The image sensor of claim 29, wherein the first and second photo-sensing devices are stacked orthogonally in the semiconductor substrate such that the first photo-sensing device is proximate to the surface of the semiconductor substrate in relation to the second photo-sensing device.

35. The image sensor of claim 29, wherein the first wavelength spectrum is an infra-red wavelength spectrum.

* * * * *